(12) United States Patent
Kucherov et al.

(10) Patent No.: US 10,592,159 B2
(45) Date of Patent: Mar. 17, 2020

(54) PROCESSING DEVICE CONFIGURED FOR DATA INTEGRITY TESTING UTILIZING REPLICATED TEST METADATA FILE

(71) Applicant: EMC IP Holding Company LLC, Hopkinton, MA (US)

(72) Inventors: Anton Kucherov, Dudley, MA (US); David Meiri, Somerville, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 52 days.

(21) Appl. No.: 16/012,931

(22) Filed: Jun. 20, 2018

(65) Prior Publication Data

US 2019/0391738 A1 Dec. 26, 2019

(51) Int. Cl.
*G06F 3/06* (2006.01)
*G11C 29/36* (2006.01)

(52) U.S. Cl.
CPC .............. *G06F 3/065* (2013.01); *G06F 3/067* (2013.01); *G06F 3/0619* (2013.01); *G06F 3/0659* (2013.01); *G06F 3/0665* (2013.01); *G11C 29/36* (2013.01)

(58) Field of Classification Search
CPC ...... G06F 3/065; G06F 3/0619; G06F 3/0659; G06F 3/067; G06F 3/0665; G11C 29/36
See application file for complete search history.

(56) References Cited

U.S. PATENT DOCUMENTS 7,444,464 B2 10/2008 Urmston et al.
8,095,726 B1 1/2012 O'Connell et al.
8,214,612 B1 7/2012 Natanzon
9,104,326 B2 8/2015 Frank et al.
(Continued)

FOREIGN PATENT DOCUMENTS

WO 2016111954 A1 7/2016

OTHER PUBLICATIONS

EMC Corporation, "Introduction to the EMC XtremIO Storage Array (Ver. 4.0): A Detailed Review," White Paper, Apr. 2015, 65 pages.
(Continued)

*Primary Examiner* — Thien Nguyen
(74) *Attorney, Agent, or Firm* — Ryan, Mason & Lewis, LLP

(57) ABSTRACT

An apparatus in one embodiment comprises at least one processing device comprising a processor coupled to a memory. The processing device is configured to schedule generation of a point-in-time replica of one or more logical storage volumes of a storage system, to generate a test metadata file for a data integrity test to be performed utilizing the point-in-time replica, and to store the test metadata file in at least one of the one or more logical storage volumes for which the point-in-time replica is to be generated. The point-in-time replica may comprise a snapshot of a replication consistency group comprising the one or more logical storage volumes of the storage system. Scheduling the generation of the point-in-time replica of the one or more logical storage volumes of the storage system illustratively comprises initiating an asynchronous replication process for a replication consistency group comprising the one or more logical storage volumes of the storage system.

20 Claims, 7 Drawing Sheets

(56) References Cited

U.S. PATENT DOCUMENTS

| | | | |
|---|---|---|---|
| 9,208,162 B1 | 12/2015 | Hallak et al. | |
| 9,286,003 B1 | 3/2016 | Hallak et al. | |
| 9,606,870 B1 | 3/2017 | Meiri et al. | |
| 9,716,754 B2 | 7/2017 | Swift | |
| 2008/0279462 A1 | 11/2008 | Celi, Jr. | |
| 2009/0132955 A1* | 5/2009 | Garg | H04L 9/3247 715/781 |
| 2010/0179941 A1 | 7/2010 | Agrawal et al. | |
| 2011/0314239 A1* | 12/2011 | Kono | G06F 11/2094 711/162 |
| 2012/0233123 A1* | 9/2012 | Shisheng | G06F 11/004 707/639 |
| 2013/0325824 A1* | 12/2013 | Shoens | G06F 16/16 707/698 |
| 2014/0181016 A1 | 6/2014 | Whitehead et al. | |
| 2016/0150012 A1 | 5/2016 | Barszczak et al. | |
| 2016/0170987 A1 | 6/2016 | Kesselman | |
| 2016/0202927 A1 | 7/2016 | Klarakis et al. | |
| 2016/0224259 A1* | 8/2016 | Ahrens | G06F 3/0619 |
| 2016/0292249 A1* | 10/2016 | Vasanth | G06F 9/4881 |

OTHER PUBLICATIONS

EMC Corporation, "Unstoppable Data Reduction: Always-on, In-Line, Zero-Penalty, Enterprise-Class, Free," https://store.emc.com/xtremio, Jul. 2014, 2 pages.

EMC Corporation, "Introduction to XtremIO Virtual Copies," White Paper, Mar. 2016, 39 pages.

EMC Corporation, "XtremIO Data Production (XDP): Flash-Specific Data Protection, Provided by XtremIO (Ver. 4.0)," White Paper, Apr. 2015, 25 pages.

Dell EMC, "XtremIO v6.0 Specifications," Specification Sheet, 2017, 4 pages.

Dell EMC, "Dell EMC XtremIO X2: Next-Generation All-Flash Array," Data Sheet, 2017, 5 pages.

EMC Corporation, "High Availability, Data Protection and Data Integrity in the XtremIO Architecture," White Paper, Apr. 2015, 28 pages.

Y. Zhang et al., "End-to-End Integrity for File Systems: A ZFS Case Study," Proceedings of the 8th USENIX Conference on File and Storage Technologies (FAST), Feb. 23-26, 2010, 14 pages.

Dell EMC, "Introduction to Dell EMC XtremIO X2 Storage Array—A Detailed Review," Dell EMC White Paper, Aug. 2017, 46 pages.

N. Tolia et al., "Opportunistic Use of Content Addressable Storage for Distributed File Systems," Proceedings of the USENIX Annual Technical Conference, Jun. 9-14, 2003, 14 pages.

EMC Corporation, "EMC Recoverpoint Replication of XtremIO: Understanding the Essentials of RecoverPoint Snap-Based Replication for XtremIO," EMC White Paper, Aug. 2015, 31 pages.

U.S. Appl. No. 15/884,577 filed in the name of Zvi Schneider et al. on Jan. 31, 2018 and entitled "Storage System with Decoupling and Reordering of Logical and Physical Capacity Removal."

U.S. Appl. No. 15/662,809 filed in the name of William Stronge et al. on Jul. 28, 2017 and entitled "Automatic Verification of Asynchronously Replicated Data."

* cited by examiner

PROCESSING DEVICE CONFIGURED FOR DATA INTEGRITY TESTING UTILIZING REPLICATED TEST METADATA FILE

FIELD

The field relates generally to information processing systems, and more particularly to storage in information processing systems.

BACKGROUND

In many information processing systems, data integrity tests are performed in order to ensure that a storage system is functioning properly. For example, data integrity tests may be used to confirm that the storage system is generating consistent point-in-time (PIT) replicas of a set of one or more logical storage volumes, possibly in conjunction with performance of a replication process involving the logical storage volumes. In these and other data integrity testing contexts, problems can arise when utilizing a test metadata file that captures write operations performed as part of a given data integrity test. For example, the test metadata file may be generated in a manner that is not fully reflected in a given PIT replica, leading to potential inaccuracies in the data integrity test results.

SUMMARY

Illustrative embodiments provide enhanced techniques for data integrity testing that advantageously avoid the problems that can arise in conjunction with generation of a test metadata file. For example, one or more such embodiments are configured to incorporate the test metadata file into a replication consistency group that is defined as part of a replication process. Such an arrangement can ensure consistency between the test metadata file and a corresponding PIT replica, thereby providing more accurate data integrity test results when utilizing the test metadata file to perform a data integrity test.

In one embodiment, an apparatus comprises at least one processing device comprising a processor coupled to a memory. The processing device is configured to schedule generation of a PIT replica of one or more logical storage volumes of a storage system, to generate a test metadata file for a data integrity test to be performed utilizing the PIT replica, and to store the test metadata file in at least one of the one or more logical storage volumes for which the PIT replica is to be generated.

The processing device in some embodiments is implemented in a host device configured to communicate over a network with the storage system. In other embodiments, the processing device is implemented in the storage system. These are only examples, and alternative implementations are possible.

In some embodiments, the PIT replica comprises a snapshot of a replication consistency group comprising the one or more logical storage volumes of the storage system.

For example, scheduling the generation of the PIT replica of the one or more logical storage volumes of the storage system may comprise initiating an asynchronous replication process for a replication consistency group comprising the one or more logical storage volumes of the storage system.

The generation of the test metadata file may comprise creating the test metadata file, and writing information characterizing a plurality of operations of the data integrity test into the test metadata file.

Storing the test metadata file in at least one of the one or more logical storage volumes for which the PIT replica is to be generated ensures that content of the test metadata file is captured in a manner consistent with generation of the PIT replica for other portions of the one or more logical storage volumes.

The test metadata file may comprise at least one test log of the data integrity test.

As another example, the test metadata file may comprise at least one designated test log volume of the storage system.

In some embodiments, the test metadata file is stored as at least a portion of a particular one of the one or more logical storage volumes of the storage system.

For example, the one or more logical storage volumes may comprise a plurality of logical storage volumes forming at least a portion of a replication consistency group with the replication consistency group being defined to include the test metadata file as at least a portion of a particular one of the plurality of logical storage volumes.

These and other illustrative embodiments include, without limitation, apparatus, systems, methods and processor-readable storage media.

DETAILED DESCRIPTION

Illustrative embodiments will be described herein with reference to exemplary information processing systems and associated computers, servers, storage devices and other processing devices. It is to be appreciated, however, that these and other embodiments are not restricted to the particular illustrative system and device configurations shown. Accordingly, the term "information processing system" as used herein is intended to be broadly construed, so as to encompass, for example, processing systems comprising cloud computing and storage systems, as well as other types of processing systems comprising various combinations of physical and virtual processing resources. An information processing system may therefore comprise, for example, at least one data center or other cloud-based system that includes one or more clouds hosting multiple tenants that share cloud resources. Numerous different types of enterprise computing and storage systems are also encompassed by the term "information processing system" as that term is broadly used herein.

Figure 1:
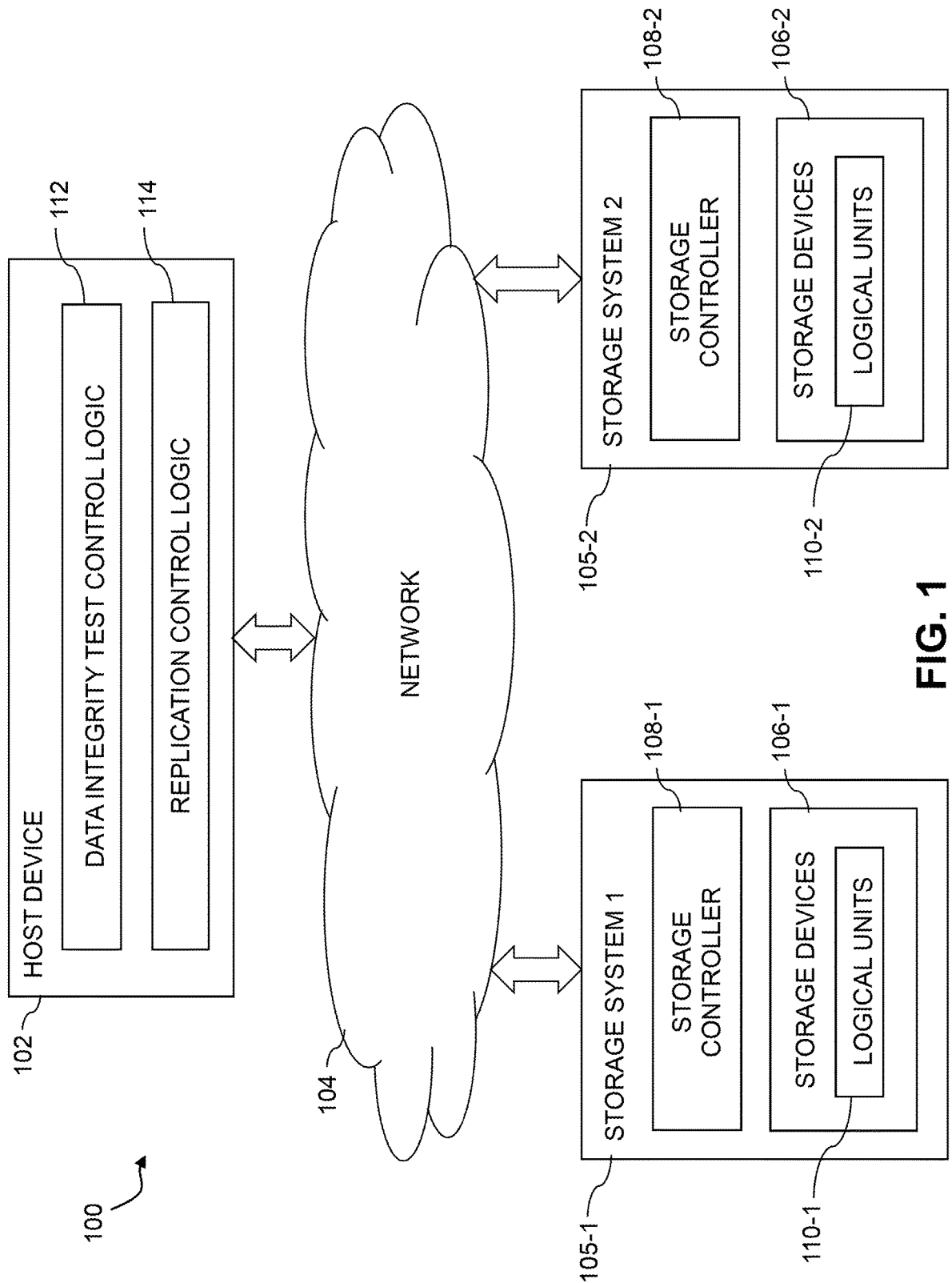
FIG. 1 is a block diagram of an information processing system comprising a host device configured with functionality for data integrity testing utilizing a replicated test metadata file in an illustrative embodiment.

FIG. 1 shows an information processing system 100 configured in accordance with an illustrative embodiment. The information processing system 100 comprises a host device 102, which may comprise one of a plurality of host devices of a computer system. The host device 102 communicates over a network 104 with first and second storage systems 105-1 and 105-2, also denoted as Storage System 1 and Storage System 2, respectively. The storage systems 105-1 and 105-2 are collectively referred to herein as storage systems 105. The host device 102 and storage systems 105 may be part of an enterprise computing and storage system, a cloud-based system or another type of system.

The host device 102 and storage systems 105 illustratively comprise respective processing devices of one or more processing platforms. For example, the host device 102 and the storage systems 105 can each comprise one or more processing devices each having a processor and a memory, possibly implementing virtual machines and/or containers, although numerous other configurations are possible.

The host device 102 and the storage systems 105 can additionally or alternatively be part of cloud infrastructure such as an Amazon Web Services (AWS) system. Other examples of cloud-based systems that can be used to provide one or more of host device 102 and storage systems 105 include Google Cloud Platform (GCP) and Microsoft Azure.

The host device 102 is configured to write data to and read data from the storage systems 105. The host device 102 and the storage systems 105 may be implemented on a common processing platform, or on separate processing platforms. A wide variety of other types of host devices can be used in other embodiments.

The host device 102 in some embodiments illustratively provides compute services such as execution of one or more applications on behalf of each of one or more users associated with the host device 102.

The term "user" herein is intended to be broadly construed so as to encompass numerous arrangements of human, hardware, software or firmware entities, as well as combinations of such entities. Compute and/or storage services may be provided for users under a platform-as-a-service (PaaS) model, although it is to be appreciated that numerous other cloud infrastructure arrangements could be used. Also, illustrative embodiments can be implemented outside of the cloud infrastructure context, as in the case of a stand-alone computing and storage system implemented within a given enterprise.

The network 104 is assumed to comprise a portion of a global computer network such as the Internet, although other types of networks can be part of the network 104, including a wide area network (WAN), a local area network (LAN), a satellite network, a telephone or cable network, a cellular network, a wireless network such as a WiFi or WiMAX network, or various portions or combinations of these and other types of networks. The network 104 in some embodiments therefore comprises combinations of multiple different types of networks each comprising processing devices configured to communicate using Internet Protocol (IP) or other communication protocols.

As a more particular example, some embodiments may utilize one or more high-speed local networks in which associated processing devices communicate with one another utilizing Peripheral Component Interconnect express (PCIe) cards of those devices, and networking protocols such as InfiniBand, Gigabit Ethernet or Fibre Channel. Numerous alternative networking arrangements are possible in a given embodiment, as will be appreciated by those skilled in the art.

The storage systems 105 are accessible to the host device 102 over the network 104. The storage system 105-1 comprises a plurality of storage devices 106-1 and an associated storage controller 108-1. Similarly, the storage system 105-2 comprises a plurality of storage devices 106-2 and an associated storage controller 108-2. The storage devices 106-1 and 106-2 are collectively referred to herein as storage devices 106. The storage controllers 108-1 and 108-2 are collectively referred to as storage controllers 108. The storage devices 106-1 and 106-2 store data of respective sets of logical units (LUNs) 110-1 and 110-2, collectively logical units or LUNS 110. The LUNs 110 may be viewed as examples of what are also referred to herein as logical storage volumes of their respective storage systems 105.

The storage devices 106 illustratively comprise solid state drives (SSDs). Such SSDs are implemented using non-volatile memory (NVM) devices such as flash memory. Other types of NVM devices that can be used to implement at least a portion of the storage devices 106 include non-volatile random access memory (NVRAM), phase-change RAM (PC-RAM) and magnetic RAM (MRAM). These and various combinations of multiple different types of NVM devices may also be used.

However, it is to be appreciated that other types of storage devices can be used in other embodiments. For example, a given storage system as the term is broadly used herein can include a combination of different types of storage devices, as in the case of a multi-tier storage system comprising a flash-based fast tier and a disk-based capacity tier. In such an embodiment, each of the fast tier and the capacity tier of the multi-tier storage system comprises a plurality of storage devices with different types of storage devices being used in different ones of the storage tiers. For example, the fast tier may comprise flash drives while the capacity tier comprises hard disk drives. The particular storage devices used in a given storage tier may be varied in other embodiments, and multiple distinct storage device types may be used within a single storage tier. The term "storage device" as used herein is intended to be broadly construed, so as to encompass, for example, flash drives, solid state drives, hard disk drives, hybrid drives or other types of storage devices.

In some embodiments, at least one of the storage systems 105 illustratively comprises a scale-out all-flash content addressable storage array such as an XtremIO™ storage array from Dell EMC of Hopkinton, Mass. Other types of storage arrays, including by way of example VNX® and Symmetrix VMAX® storage arrays also from Dell EMC, can be used to implement one or both of storage systems 105 in other embodiments.

The term "storage system" as used herein is therefore intended to be broadly construed, and should not be viewed as being limited to content addressable storage systems or flash-based storage systems. A given storage system as the term is broadly used herein can comprise, for example, network-attached storage (NAS), storage area networks (SANs), direct-attached storage (DAS) and distributed DAS, as well as combinations of these and other storage types, including software-defined storage.

Other particular types of storage products that can be used in implementing storage systems 105 in illustrative embodiments include all-flash and hybrid flash storage arrays such as Unity™ software-defined storage products such as ScaleIO™ and ViPR®, cloud storage products such as Elastic Cloud Storage (ECS), object-based storage products such as Atmos®, and scale-out NAS clusters comprising Isilon® platform nodes and associated accelerators, all from Dell EMC. Combinations of multiple ones of these and other storage products can also be used in implementing a given storage system in an illustrative embodiment.

The host device 102 in the FIG. 1 embodiment includes data integrity test control logic 112. The data integrity test control logic is configured to control performance of a data integrity test process such as that illustrated in the flow diagram of FIG. 3. Information characterizing test patterns and other types of known test data utilized in the data integrity test process are maintained in a memory of the host device 102 under the control of the data integrity test control logic 112. The host device 102 in the present embodiment further comprises replication control logic 114, which may comprise a snapshot generator and other components utilized in an asynchronous replication process.

The snapshot generator of the replication control logic 114 is an example of what is more generally referred to herein as a PIT replica generator. In some embodiments, the PIT replica generator is implemented externally to the replication control logic 114.

The host device 102 should also be understood to include additional modules and other components typically found in conventional implementations of computers, servers or other host devices, although such additional modules and other components are omitted from the figure for clarity and simplicity of illustration. For example, the host device 102 can comprise various types of data consistency software that operates in conjunction with the data integrity test control logic 112 in performing data integrity test processes in system 100. Conventional aspects of such data integrity test processes are well known to those skilled in the art and therefore are not described in detail herein.

The data integrity test control logic 112 in some embodiments includes at least portions of the above-noted data consistency software. For example, it is possible that the data integrity test control logic 112 may comprise otherwise conventional data consistency software suitably modified as disclosed herein to provide support for data integrity testing using a replicated test metadata file. Other combinations of software, hardware and firmware may be used to implement data integrity test control logic in other embodiments.

A given data integrity test process in the system 100 illustratively involves writing a pattern of data in one or more different write data sizes, and then reading the corresponding written data to check for consistency. In some embodiments, the data integrity test process checks consistency of written known test data against a particular PIT replica, such as a snapshot of one or more of the logical units 110.

As mentioned previously, in these and other data integrity testing contexts, problems can arise when utilizing a test metadata file that captures write operations performed as part of a given data integrity test. For example, the test metadata file may be generated in a manner that is not fully reflected in a given PIT replica, leading to potential inaccuracies in the data integrity test results.

These and other drawbacks of conventional practice are overcome in illustrative embodiments through the use of a replicated test metadata file, as will now be described in more detail.

The host device 102 via its data integrity test control logic 112 is configured to utilize a replicated test metadata file in conjunction with performance of a data integrity test process in the system 100. The test metadata file is "replicated" in illustrative embodiments by including the test metadata file in a consistency group of an asynchronous replication process controlled by the replication control logic 114. Such an arrangement advantageously avoids potential inconsistencies that might otherwise arise between the test metadata file and a PIT replica that is utilized in a data integrity test process.

The host device 102 in providing a replicated test metadata file of the type described above is illustratively configured to schedule generation of a PIT replica of one or more logical storage volumes of a particular one of the storage systems 105, to generate a test metadata file for a data integrity test to be performed utilizing the PIT replica, and to store the test metadata file in at least one of the one or more logical storage volumes for which the PIT replica is to be generated. The PIT replica may more particularly comprise a snapshot of a replication consistency group comprising the one or more logical storage volumes of the storage system.

In some embodiments, the above-noted data consistency software or other implementation of data integrity test control logic 112 is illustratively configured to perform at least portions of the data integrity test.

Scheduling the generation of the PIT replica of the one or more logical storage volumes of the storage system illustratively comprises initiating an asynchronous replication process for a replication consistency group comprising the one or more logical storage volumes of the storage system.

For example, the asynchronous replication process may comprise asynchronous replication of at least a subset of the logical units 110-1 of storage system 105-1 to corresponding ones of the logical units 110-2 of the second storage system 105-2. An asynchronous replication process of this type is illustratively controlled at least in part by the host device 102, but in other embodiments can be controlled at least in part by one or both of the storage systems 105. Other asynchronous replication processes may replicate at least a subset of the logical units 110-2 of the second storage system 105-2 to corresponding ones of the logical units 110-1 of the first storage system 105-1. Thus, designated logical units of one of the first and second storage systems 105 may be sources of the replication process while designated logical units of the other of the first and second storage systems 105 may be targets of the replication process. Numerous other replication processes may be used in other embodiments.

The asynchronous replication process in some embodiments more particularly comprises cycle-based asynchronous replication configured to periodically transfer data of a given replication consistency group in multiple cycles from the source to the target.

Further details regarding asynchronous replication processes suitable for use in illustrative embodiments herein can be found in U.S. patent application Ser. No. 15/662,809, filed Jul. 28, 2017 and entitled "Automatic Verification of Asynchronously Replicated Data," which is incorporated by reference herein. Other embodiments need not utilize these automatic verification techniques, and can be implemented using alternative verification techniques as well as other types of replication processes. Accordingly, illustrative embodiments herein are not limited to use with asynchronous replication processes, but are more generally applicable to other types of data replication.

In some embodiments, the test metadata file specifies a plurality of write operations of a data integrity test. For example, each such write operation can specify the writing of particular known test data to pages of one or more logical storage volumes of a storage system. The generation of the test metadata file may therefore comprise creating the test metadata file, and then writing or otherwise capturing information characterizing multiple operations of a data integrity test into the test metadata file. The information characterizing the multiple operations may comprise the operations themselves.

The term "page" as used herein is intended to be broadly construed so as to encompass any of a wide variety of different types of blocks that may be utilized in a block storage device of a storage system. Such storage systems are not limited to content addressable storage systems of the type disclosed in some embodiments herein, but are more generally applicable to any storage system that includes one or more block storage devices. Different page sizes are generally utilized in different storage systems of different types. For example, XtremIO™ X1 storage arrays typically utilize a page size of 8 KB, while XtremIO™ X2 storage arrays typically utilize a page size of 16 KB. Larger page sizes of 64 KB and 128 KB are typically utilized in VMAX® V2 and VMAX® V3 storage arrays, respectively.

The term "test metadata file" as used herein is intended to be broadly construed so as to encompass information specifying one or more write operations to be performed in conjunction with a given data integrity test and possibly additional or alternative information such as information characterizing test data to be written as part of a data integrity test, and/or particular logical storage volumes, pages or other blocks to be written as part the data integrity test. Also, a given "test metadata file" as that term is broadly used herein may comprise a combination of multiple smaller files, each containing a different portion of a set of information characterizing at least one data integrity test to be performed.

Examples of particular implementations of a given test metadata file in some embodiments include at least one test log of the data integrity test or at least one designated test log volume of the storage system.

As a more particular illustration of an arrangement of the latter type, a particular one of the logical units 110 may be designated by the host device 102 and/or by the corresponding one of the storage systems 105 as a test log volume. That test log volume is then included in a replication consistency group defined in conjunction with establishment of an asynchronous replication process in system 100.

A more detailed example of an embodiment utilizing a replication consistency group will be described below in conjunction with FIG. 4.

The test metadata file in such embodiments may be illustratively stored as at least a portion of a particular one of the one or more logical storage volumes of the storage system, for example, as at least part of a designated one of the logical units 110.

In some embodiments, storing the test metadata file in at least one of the one or more logical storage volumes for which the PIT replica is to be generated ensures that content of the test metadata file is captured in a manner consistent with generation of the PIT replica for other portions of the one or more logical storage volumes.

Terms such as "store" and "storing" as used herein in conjunction with the test metadata file are intended to be broadly construed, and should be understood to encompass various techniques for writing, updating or otherwise capturing the test metadata file into at least one of the one or more logical storage volumes for which the PIT replica is to be generated.

As indicated above, the one or more logical storage volumes in some embodiments illustratively comprise a plurality of logical storage volumes forming at least a portion of a specified replication consistency group, with the replication consistency group being defined to include the test metadata file as at least a portion of a particular one of the plurality of logical storage volumes.

The data integrity test process implemented by the host device 102 is illustratively configured to confirm consistency of pages written by one or more write operations relative to the corresponding PIT replica generated by the replication control logic 114. For example, the pages written by a given write operation may comprise respective pages of known test data, and a read operation of the data integrity test process may be configured to read the pages from the PIT replica generated by the replication control logic 114. The PIT replica illustratively comprises a snapshot of one or more of the logical units 110 or other logical storage volumes of at least one of the storage systems 105.

As mentioned previously, such snapshots may be generated in various contexts, such as in conjunction with asynchronous replication of at least a subset of the logical units 110-1 of storage system 105-1 to corresponding ones of the logical units 110-2 of the second storage system 105-2. An asynchronous replication process of this type is illustratively controlled at least in part by the host device 102, but in other embodiments can be controlled at least in part by one or both of the storage systems 105.

Terms such as "integrity" and "data integrity test" as used herein are intended to be broadly construed so as to encompass a wide variety of different arrangements for confirming consistency of data written to one or more storage devices. For example, integrity of written data pages may be determined by comparing those data pages in a particular PIT replica to known test data patterns that were written to the corresponding pages in conjunction with execution of one or more write operations in a data integrity test process.

These and other operations carried out in conjunction with a process for data integrity testing utilizing a replicated test metadata file in the host device 102 are illustratively performed at least in part under the control of the data integrity test control logic 112. Such operations illustratively utilize the snapshots or other PIT replicas generated by the replication control logic 114.

The host device 102 and storage systems 105 in the FIG. 1 embodiment are assumed to be implemented using at least one processing platform each comprising one or more processing devices each having a processor coupled to a memory. Such processing devices can illustratively include particular arrangements of compute, storage and network resources.

The host device 102 and the storage systems 105 may be implemented on respective distinct processing platforms, although numerous other arrangements are possible. For example, in some embodiments at least portions of the host device 102 and one or both of the storage systems 105 are implemented on the same processing platform. The storage systems 105 can therefore be implemented at least in part within at least one processing platform that implements at least a portion of the host device 102.

The term "processing platform" as used herein is intended to be broadly construed so as to encompass, by way of illustration and without limitation, multiple sets of processing devices and associated storage systems that are configured to communicate over one or more networks. For example, distributed implementations of the system 100 are possible, in which certain components of the system reside in one data center in a first geographic location while other components of the system reside in one or more other data centers in one or more other geographic locations that are potentially remote from the first geographic location. Thus, it is possible in some implementations of the system 100 for the host device 102 and storage systems 105 to reside in different data centers. Numerous other distributed implementations of one or both of the host device 102 and the storage systems 105 are possible. Accordingly, the storage systems 105 can also be implemented in a distributed manner across multiple data centers.

Additional examples of processing platforms utilized to implement host devices and/or storage systems in illustrative embodiments will be described in more detail below in conjunction with FIGS. 6 and 7.

It is to be appreciated that these and other features of illustrative embodiments are presented by way of example only, and should not be construed as limiting in any way.

Accordingly, different numbers, types and arrangements of system components such as host device 102, network 104, storage systems 105, storage devices 106, storage controllers 108 and logical units 110 can be used in other embodiments.

It should be understood that the particular sets of modules and other components implemented in the system 100 as illustrated in FIG. 1 are presented by way of example only. In other embodiments, only subsets of these components, or additional or alternative sets of components, may be used, and such components may exhibit alternative functionality and configurations. Additional examples of systems implementing data integrity test functionality will be described below.

Figure 2:
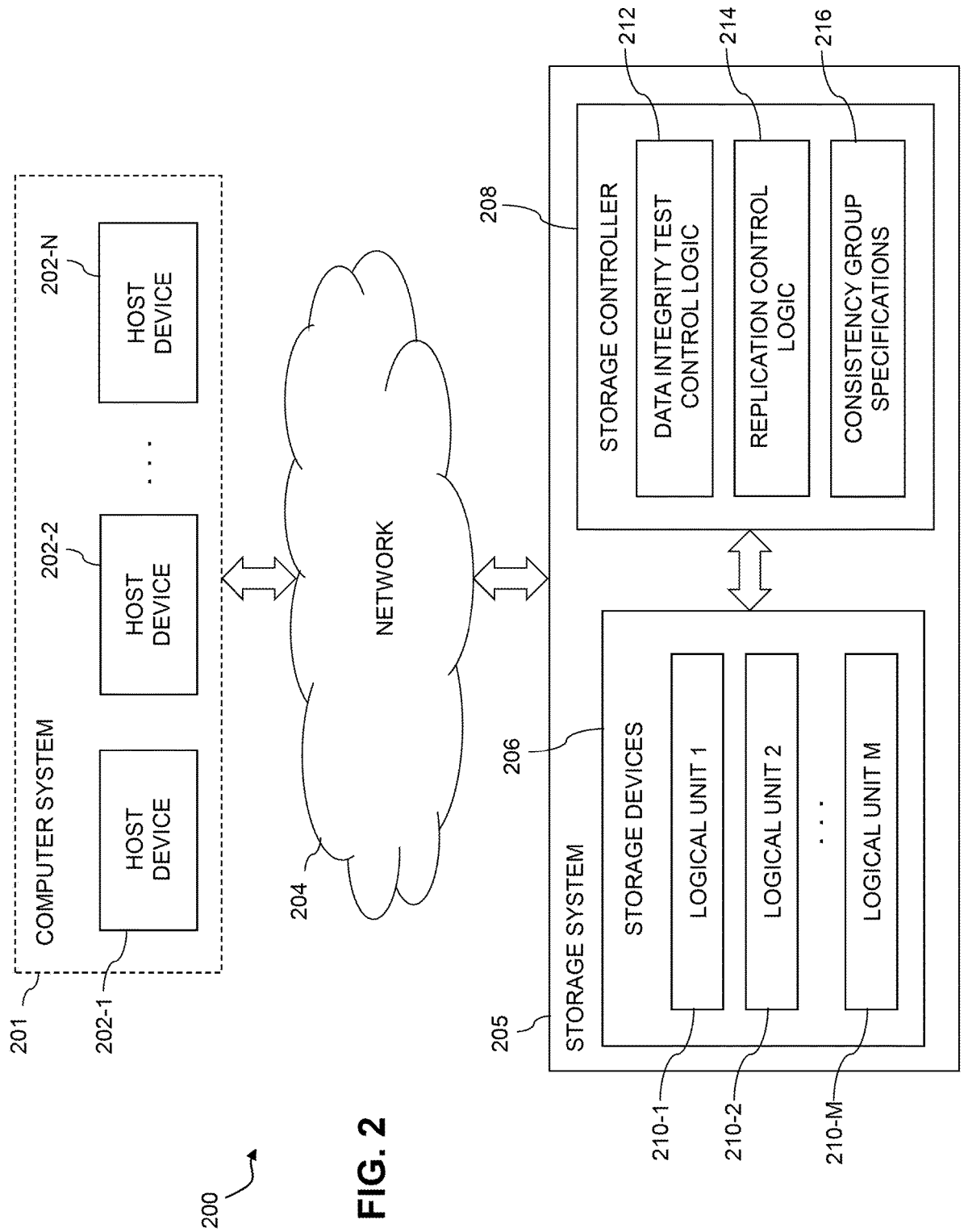
FIG. 2 is a block diagram of an information processing system comprising a storage system configured with functionality for data integrity testing utilizing a replicated test metadata file in an illustrative embodiment.

FIG. 2 shows an information processing system 200 configured in accordance with another illustrative embodiment. The information processing system 200 comprises a computer system 201 that includes host devices 202-1, 202-2, . . . 202-N. The host devices 202 communicate over a network 204 with a storage system 205. The computer system 201 is assumed to comprise an enterprise computer system, cloud-based computer system or other arrangement of multiple compute nodes associated with respective users. The host devices 202 of the computer system 201 in some embodiments illustratively provide compute services such as execution of one or more applications on behalf of each of one or more users associated with respective ones of the host devices 202.

Similar to the storage systems 105 of system 100, the storage system 205 comprises storage devices 206, storage controller 208 and logical units 210-1, 210-2, . . . 210-M. However, in this embodiment, the data integrity test functionality is implemented in the storage system 205, rather than in one of the host devices 202. Accordingly, the storage controller 208 in this embodiment comprises modules 212 and 214, which are configured to operate in substantially the same manner as that described above for respective corresponding modules 112 and 114 of the host device 102 in the system 100.

The storage controller 208 in this embodiment further comprises consistency group specifications 216, at least one of which defines a replication consistency group comprising at least a subset of the logical units 210, with at least one of those logical units 210 being configured to store a test metadata file for use in performing a data integrity test on a PIT replica of the replication consistency group. Multiple distinct replication consistency groups can be defined in the consistency group specifications 216. Similar consistency group specifications can be used in host device 102 of system 100 and in other systems disclosed herein, although not explicitly shown in the corresponding figures.

In some embodiments, functionality for data integrity testing utilizing a replicated test metadata file as disclosed herein can be implemented partially in a host device and partially in a storage system. Accordingly, illustrative embodiments are not limited to arrangements in which all such functionality is implemented in a host device or a storage system, and therefore encompass various hybrid arrangements in which the functionality is distributed over one or more host devices and one or more storage systems, each comprising one or more processing devices.

The operation of the information processing systems 100 and 200 will now be described in further detail with reference to the flow diagram of the illustrative embodiment of FIG. 3. This figure illustrates a process that includes steps 300 through 308, and is suitable for use in systems 100 and 200 but is more generally applicable to other types of information processing systems in which a host device and/or storage system is configured to perform data integrity testing. The steps of the flow diagram are illustratively performed at least in part under the control of the data integrity test control logic implemented in module 112 in host device 102 of system 100 or in module 212 in storage controller 208 of system 200.

In step 300, an asynchronous replication process is initiated for a replication consistency group comprising designated logical storage volumes of a storage system. The term "replication consistency group" as used herein is intended to be broadly construed so as to encompass, for example, a group comprising one or more logical units or other logical storage volumes for which consistency is to be maintained between source and target of a given asynchronous replication process. The source and target may illustratively comprise respective distinct storage systems, such as the first and second storage systems 105 of system 100, or different portions of the same storage system.

In step 302, a test metadata file is generated for a data integrity test to be applied to a PIT replica generated for the replication consistency group. Generating the test metadata file may comprise, for example, creating the test metadata file, and writing information characterizing a plurality of operations of the data integrity test into the test metadata file. The test metadata file may comprise, for example, at least one test log of the data integrity test, or at least one designated test log volume of the storage system.

In step 304, the test metadata file is stored in a particular one of the designated logical storage volumes of the replication consistency group.

Figure 4:
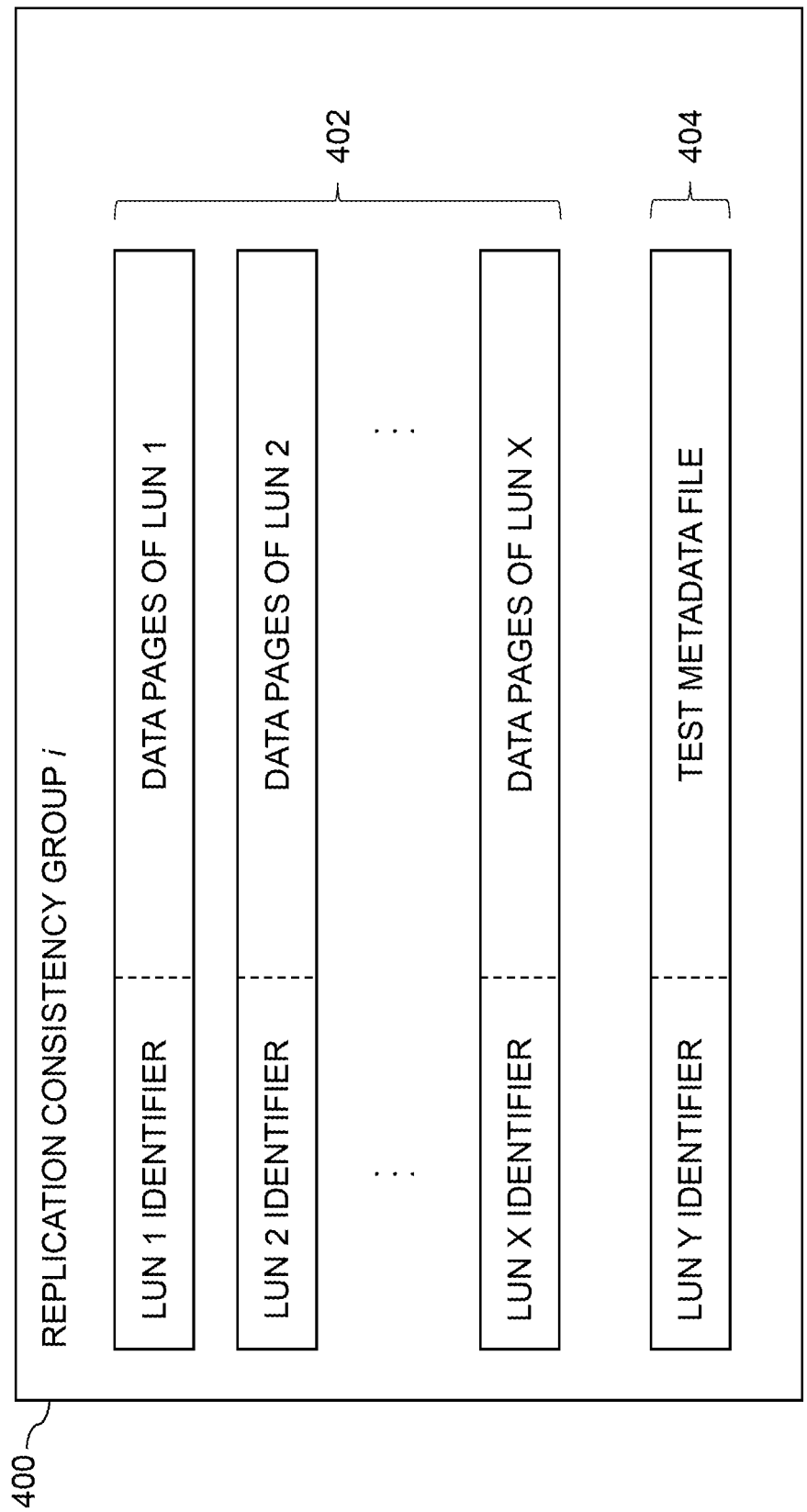
FIG. 4 shows an example of a replication consistency group defined to include a test metadata file as one of a plurality of logical storage volumes in an illustrative embodiment.

An example of an arrangement of this type is illustrated in FIG. 4, which shows a particular replication consistency group i defined as part of an asynchronous replication process. The replication consistency group is also denoted by reference numeral 400, and illustratively includes a plurality of logical units 402 of a storage system and an additional logical unit 404 of the storage system. This is an example of an arrangement in which a replication consistency group is defined to include a test metadata file as one of a plurality of logical storage volumes. The logical units 402 comprise respective LUN identifiers 1, 2, . . . X and respective sets of pages, as illustrated in the figure. The logical unit 404 comprises a LUN identifier Y and the test metadata file. Numerous alternative configurations of replication consistency groups, logical units and test metadata files may be used in other embodiments.

Storing the test metadata file in a particular one of the designated logical storage volumes of the replication consistency group 400 ensures that content of the test metadata file is captured in a manner consistent with generation of the PIT replica.

For example, snapshot management functionality of replication control logic of a host device and/or a storage system can automatically provide consistency between a given snapshot of the replication consistency group 400 and the test metadata file utilized in performing a data integrity test for the given snapshot.

In some embodiments, step 304 is instead implemented by modifying the replication consistency group to include an additional volume, and then storing the test metadata file in this additional volume. The particular volume in which the test metadata file is stored in step 304 can therefore comprise a volume added to the replication consistency group for this purpose subsequent to its initial definition. Numerous other alternative arrangements involving replication consistency groups and associated volumes, at least one of which stores a test metadata file, can be used.

In step 306, a PIT replica of the replication consistency group is generated in accordance with the asynchronous replication process. The PIT replica illustratively comprises a snapshot of the replication consistency group comprising the designated logical storage volumes of the storage system.

In step 308, the test metadata file is utilized to perform a data integrity test on the PIT replica of the replication consistency group. For example, the data integrity test may be configured to confirm consistency of a plurality of data pages written by one or more write operations relative to the PIT replica.

After performance of the data integrity test on the PIT replica of the replication consistency group, the process may return to step 306 to repeat multiple instances of steps 306 and 308 to provide data integrity testing for respective additional PIT replicas.

Additionally or alternatively, the process may in some cases return to step 302 to generate a new test metadata file that is stored in step 304 and utilized to test one or more PIT replicas in steps 306 and 308.

It is also possible that the process may return to step 300 to initiate an asynchronous replication process for a different replication consistency group.

As noted above, the data integrity test performed in step 308 may be configured to confirm consistency of pages written by a plurality of write operations specified in the test metadata file with reference to a corresponding PIT replica. Data consistency software may be used to identify one or more pages for a given one of the write operations, and to execute the given write operation for those pages.

In some embodiments, the pages written by a given write operation comprise respective pages of known test data and a given read operation of the data integrity test process is configured to read the pages from the PIT replica.

The data integrity test process can therefore include additional operations relating to comparison of the written test data pages with corresponding pages read from the PIT replica in determining data integrity. As mentioned previously, the PIT replica can comprise a snapshot of one or more logical storage volumes of a storage system.

Figure 3:
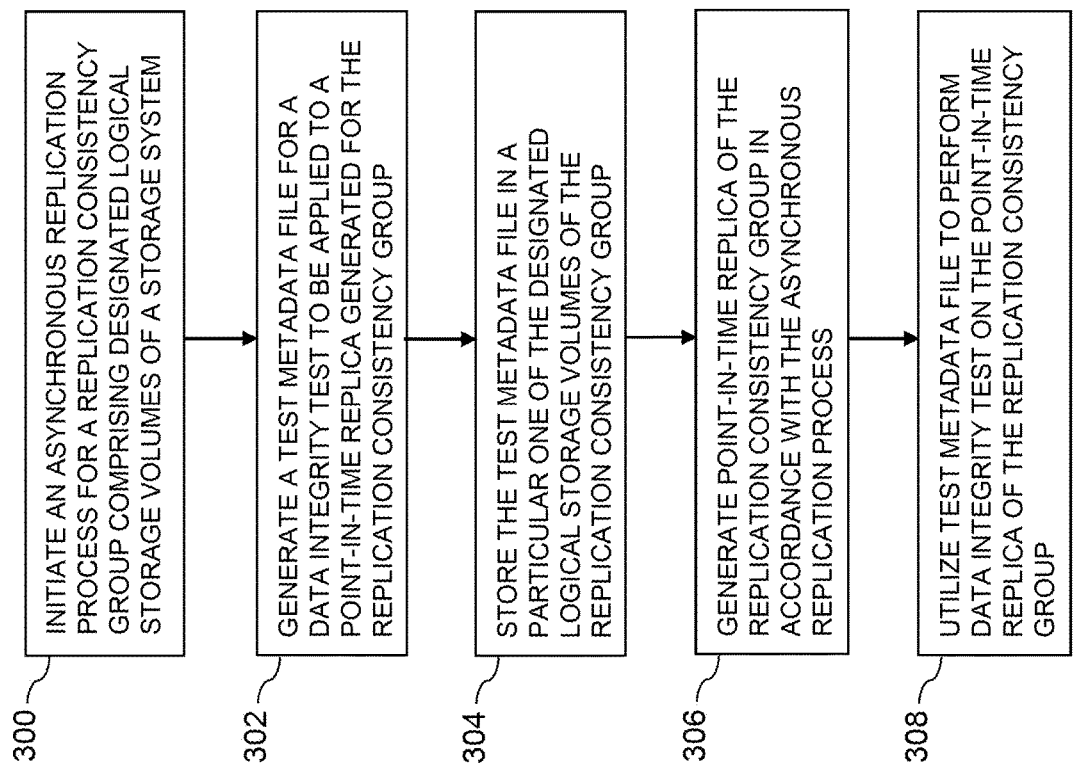
FIG. 3 is a flow diagram of a process for data integrity testing utilizing a replicated test metadata file in an illustrative embodiment.

The particular processing operations and other system functionality described in conjunction with the flow diagram of FIG. 3 are presented by way of illustrative example only, and should not be construed as limiting the scope of the disclosure in any way. Alternative embodiments can use other types of processing operations for performing data integrity tests. For example, the ordering of the process steps may be varied in other embodiments, or certain steps may be performed at least in part concurrently with one another rather than serially. Also, one or more of the process steps may be repeated periodically, or multiple instances of the process can be performed in parallel with one another in order to implement a plurality of different data integrity test processes for respective different datasets or for different storage systems or portions thereof within a given information processing system.

Functionality such as that described in conjunction with the flow diagram of FIG. 3 can be implemented at least in part in the form of one or more software programs stored in memory and executed by a processor of a processing device such as a computer or server. As will be described below, a memory or other storage device having executable program code of one or more software programs embodied therein is an example of what is more generally referred to herein as a "processor-readable storage medium."

For example, a host device such as host device 102 or a storage controller such as storage controller 208 that is configured to control performance of one or more steps of the process of the flow diagram of FIG. 3 in its corresponding system 100 or 200 can be implemented as part of what is more generally referred to herein as a processing platform comprising one or more processing devices each comprising a processor coupled to a memory. A given such processing device may correspond to one or more virtual machines or other types of virtualization infrastructure such as Docker containers or Linux containers (LXCs). The host device 102 of system 100 or the storage controller 208 of system 200, as well as other system components, may be implemented at least in part using processing devices of such processing platforms. For example, in a distributed implementation of the storage controller 208, respective distributed modules of such a storage controller can be implemented in respective containers running on respective ones of the processing devices of a processing platform.

In some embodiments, the storage system comprises an XtremIO™ storage array or other type of content addressable storage system suitably modified to incorporate data integrity testing utilizing a replicated test metadata file as disclosed herein.

An illustrative embodiment of such a content addressable storage system will now be described with reference to FIG. 5. In this embodiment, a content addressable storage system 505 comprises a plurality of storage devices 506 and an associated storage controller 508. The content addressable storage system 505 may be viewed as a particular implementation of the storage system 205, and accordingly is assumed to be coupled to host devices 202 of computer system 201 via network 204 within information processing system 200.

The storage controller 508 in the present embodiment is configured to implement data integrity test functionality of the type previously described in conjunction with FIGS. 1 through 4.

The storage controller 508 includes distributed modules 512 and 514, which are configured to operate in a manner similar to that described above for respective corresponding modules 112, 212 and 114, 214.

Figure 5:
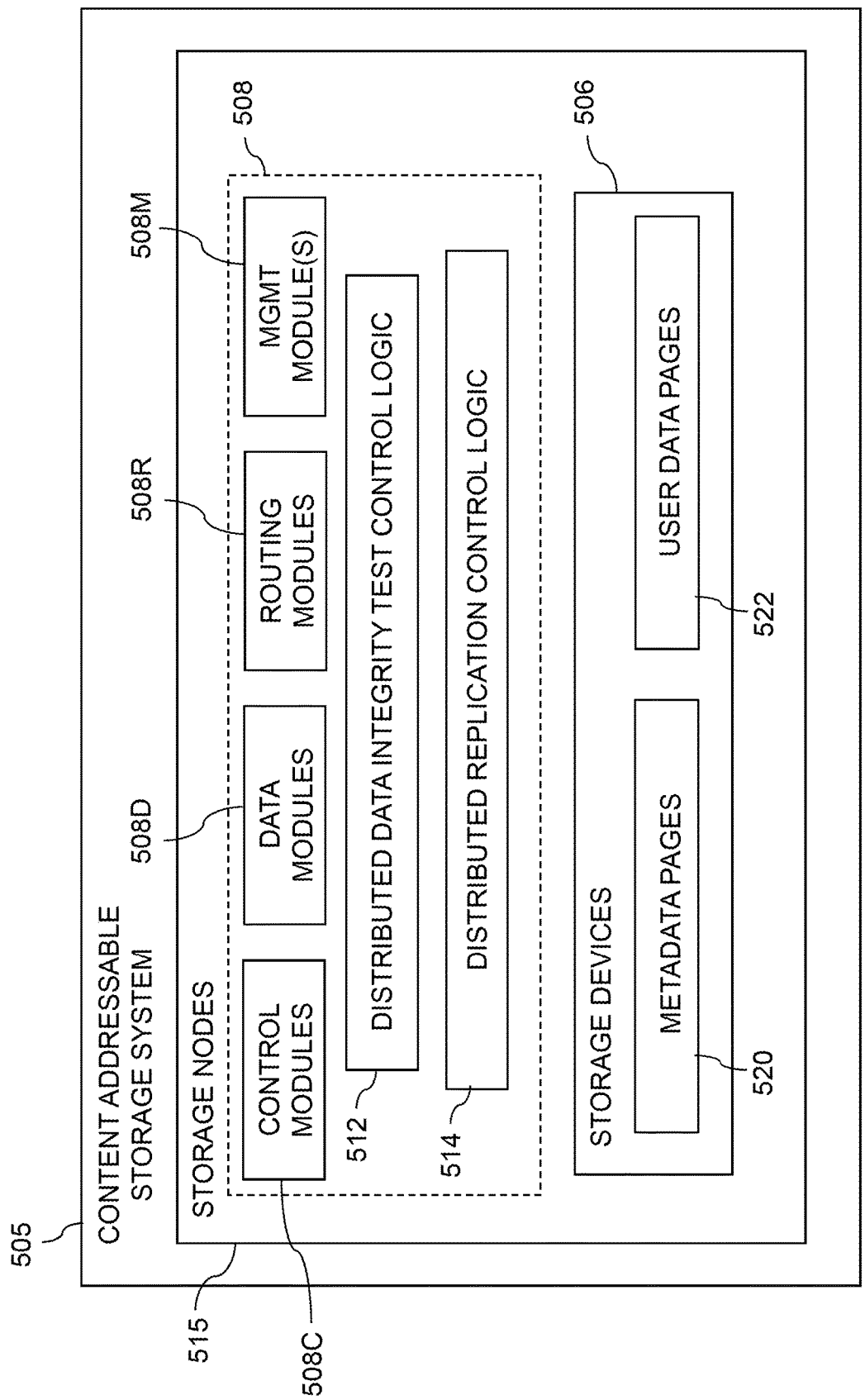
FIG. 5 shows a content addressable storage system having a distributed storage controller configured with functionality for data integrity testing utilizing a replicated test metadata file in an illustrative embodiment.

The content addressable storage system 505 in the FIG. 5 embodiment is implemented as at least a portion of a clustered storage system and includes a plurality of storage nodes 515 each comprising a corresponding subset of the storage devices 506. Other clustered storage system arrangements comprising multiple storage nodes can be used in other embodiments. A given clustered storage system may include not only storage nodes 515 but also additional storage nodes coupled to network 204. Alternatively, such additional storage nodes may be part of another clustered storage system of the system 200. Each of the storage nodes 515 of the storage system 505 is assumed to be implemented using at least one processing device comprising a processor coupled to a memory.

The storage controller 508 of the content addressable storage system 505 is implemented in a distributed manner so as to comprise a plurality of distributed storage controller components implemented on respective ones of the storage nodes 515. The storage controller 508 is therefore an example of what is more generally referred to herein as a "distributed storage controller." In subsequent description herein, the storage controller 508 may be more particularly referred to as a distributed storage controller.

Each of the storage nodes 515 in this embodiment further comprises a set of processing modules configured to communicate over one or more networks with corresponding sets of processing modules on other ones of the storage nodes 515. The sets of processing modules of the storage nodes 515 collectively comprise at least a portion of the distributed storage controller 508 of the content addressable storage system 505.

The modules of the distributed storage controller 508 in the present embodiment more particularly comprise different sets of processing modules implemented on each of the storage nodes 515. The set of processing modules of each of the storage nodes 515 comprises at least a control module 508C, a data module 508D and a routing module 508R. The distributed storage controller 508 further comprises one or more management ("MGMT") modules 508M. For example, only a single one of the storage nodes 515 may include a management module 508M. It is also possible that management modules 508M may be implemented on each of at least a subset of the storage nodes 515.

Each of the storage nodes 515 of the storage system 505 therefore comprises a set of processing modules configured to communicate over one or more networks with corresponding sets of processing modules on other ones of the storage nodes. A given such set of processing modules implemented on a particular storage node illustratively includes at least one control module 508C, at least one data module 508D and at least one routing module 508R, and possibly a management module 508M. These sets of processing modules of the storage nodes collectively comprise at least a portion of the distributed storage controller 508.

Communication links may be established between the various processing modules of the distributed storage controller 508 using well-known communication protocols such as IP and Transmission Control Protocol (TCP). For example, respective sets of IP links used in data transfer and corresponding messaging could be associated with respective different ones of the routing modules 508R.

Although shown as separate modules of the distributed storage controller 508, the modules 512 and 514 in the present embodiment are assumed to be distributed at least in part over at least a subset of the other modules 508C, 508D, 508R and 508M of the storage controller 508. Accordingly, at least portions of the data integrity test functionality of the modules 512 and 514 may be implemented in one or more of the other modules of the storage controller 508. In other embodiments, the modules 512 and 514 may be implemented as stand-alone modules of the storage controller 508.

The storage devices 506 are configured to store metadata pages 520 and user data pages 522, and may also store additional information not explicitly shown such as checkpoints and write journals. The metadata pages 520 and the user data pages 522 are illustratively stored in respective designated metadata and user data areas of the storage devices 506. Accordingly, metadata pages 520 and user data pages 522 may be viewed as corresponding to respective designated metadata and user data areas of the storage devices 506.

A given "page" as the term is broadly used herein should not be viewed as being limited to any particular range of fixed sizes. In some embodiments, a page size of 8 KB is used, but this is by way of example only and can be varied in other embodiments. For example, page sizes of 4 KB, 16 KB or other values can be used. Accordingly, illustrative embodiments can utilize any of a wide variety of alternative paging arrangements for organizing the metadata pages 520 and the user data pages 522.

The user data pages 522 are part of a plurality of LUNs configured to store files, blocks, objects or other arrangements of data, each also generally referred to herein as a "data item," on behalf of users associated with host devices 202. Each such LUN may comprise particular ones of the above-noted pages of the user data area. The user data stored in the user data pages 522 can include any type of user data that may be utilized in the system 200. The term "user data" herein is therefore also intended to be broadly construed.

A given data integrity test implemented at least in part using modules 512 and 514 is illustratively performed on a set of LUNs, each including multiple ones of the user data pages 522 stored in storage devices 506.

The content addressable storage system 505 in the embodiment of FIG. 5 is configured to generate hash metadata providing a mapping between content-based digests of respective ones of the user data pages 522 and corresponding physical locations of those pages in the user data area. Content-based digests generated using hash functions are also referred to herein as "hash digests." Such hash digests or other types of content-based digests are examples of what are more generally referred to herein as "content-based signatures" of the respective user data pages 522. The hash metadata generated by the content addressable storage system 505 is illustratively stored as metadata pages 520 in the metadata area. The generation and storage of the hash metadata is assumed to be performed under the control of the storage controller 508.

Each of the metadata pages 520 characterizes a plurality of the user data pages 522. For example, a given set of user data pages representing a portion of the user data pages 522 illustratively comprises a plurality of user data pages denoted User Data Page 1, User Data Page 2, . . . User Data Page n. It should be noted that usage of the variable n in this user data page context is unrelated to its usage elsewhere herein.

Each of the user data pages 522 in this example is characterized by a LUN identifier, an offset and a content-based signature. The content-based signature is generated as a hash function of content of the corresponding user data page. Illustrative hash functions that may be used to generate the content-based signature include the above-noted SHA1 hash function, or other secure hashing algorithms known to those skilled in the art. The content-based signature is utilized to determine the location of the corresponding user data page within the user data area of the storage devices 506.

Each of the metadata pages 520 in the present embodiment is assumed to have a signature that is not content-based. For example, the metadata page signatures may be generated using hash functions or other signature generation algorithms that do not utilize content of the metadata pages as input to the signature generation algorithm. Also, each of the metadata pages is assumed to characterize a different set of the user data pages.

A given set of metadata pages representing a portion of the metadata pages 520 in an illustrative embodiment comprises metadata pages denoted Metadata Page 1, Metadata Page 2, . . . Metadata Page m, having respective signatures denoted Signature 1, Signature 2, . . . Signature m. Each such metadata page characterizes a different set of n user data pages. For example, the characterizing information in each metadata page can include the LUN identifiers, offsets and content-based signatures for each of the n user data pages that are characterized by that metadata page. It is to be appreciated, however, that the user data and metadata page configurations described above are examples only, and numerous alternative user data and metadata page configurations can be used in other embodiments.

Ownership of a user data logical address space within the content addressable storage system 505 is illustratively distributed among the control modules 508C.

The data integrity test functionality provided by modules 512 and 514 in this embodiment is assumed to be distributed across multiple distributed processing modules, including at least a subset of the processing modules 508C, 508D, 508R and 508M of the distributed storage controller 508.

For example, the management module 508M of the storage controller 508 may include data integrity test control logic that engages corresponding data integrity test control logic instances in all of the control modules 508C and routing modules 508R in order to implement a data integrity test process.

In some embodiments, the content addressable storage system 505 comprises an XtremIO™ storage array suitably modified to incorporate techniques for data integrity testing utilizing a replicated test metadata file as disclosed herein.

In arrangements of this type, the control modules 508C, data modules 508D and routing modules 508R of the distributed storage controller 508 illustratively comprise respective C-modules, D-modules and R-modules of the XtremIO™ storage array. The one or more management modules 508M of the distributed storage controller 508 in such arrangements illustratively comprise a system-wide management module ("SYM module") of the XtremIO™ storage array, although other types and arrangements of system-wide management modules can be used in other embodiments. Accordingly, data integrity test functionality in some embodiments is implemented under the control of at least one system-wide management module of the distributed storage controller 508, utilizing the C-modules, D-modules and R-modules of the XtremIO™ storage array.

In the above-described XtremIO™ storage array example, each user data page has a fixed size such as 8 KB and its content-based signature is a 20-byte signature generated using an SHA1 hash function. Also, each page has a LUN identifier and an offset, and so is characterized by <lun_id, offset, signature>.

The content-based signature in the present example comprises a content-based digest of the corresponding data page. Such a content-based digest is more particularly referred to as a "hash digest" of the corresponding data page, as the content-based signature is illustratively generated by applying a hash function such as SHA1 to the content of that data page. The full hash digest of a given data page is given by the above-noted 20-byte signature. The hash digest may be represented by a corresponding "hash handle," which in some cases may comprise a particular portion of the hash digest. The hash handle illustratively maps on a one-to-one basis to the corresponding full hash digest within a designated cluster boundary or other specified storage resource boundary of a given storage system. In arrangements of this type, the hash handle provides a lightweight mechanism for uniquely identifying the corresponding full hash digest and its associated data page within the specified storage resource boundary. The hash digest and hash handle are both considered examples of "content-based signatures" as that term is broadly used herein.

Examples of techniques for generating and processing hash handles for respective hash digests of respective data pages are disclosed in U.S. Pat. No. 9,208,162, entitled "Generating a Short Hash Handle," and U.S. Pat. No. 9,286,003, entitled "Method and Apparatus for Creating a Short Hash Handle Highly Correlated with a Globally-Unique Hash Signature," both of which are incorporated by reference herein.

As mentioned previously, storage controller components in an XtremIO™ storage array illustratively include C-module, D-module and R-module components. For example, separate instances of such components can be associated with each of a plurality of storage nodes in a clustered storage system implementation.

The distributed storage controller in this example is configured to group consecutive pages into page groups, to arrange the page groups into slices, and to assign the slices to different ones of the C-modules. For example, if there are 1024 slices distributed evenly across the C-modules, and there are a total of 16 C-modules in a given implementation, each of the C-modules "owns" 1024/16=64 slices. In such arrangements, different ones of the slices are assigned to different ones of the control modules 508C such that control of the slices within the storage controller 508 of the storage system 505 is substantially evenly distributed over the control modules 508C of the storage controller 508.

The D-module allows a user to locate a given user data page based on its signature. Each metadata page also has a size of 8 KB and includes multiple instances of the <lun_id, offset, signature> for respective ones of a plurality of the user data pages. Such metadata pages are illustratively generated by the C-module but are accessed using the D-module based on a metadata page signature.

The metadata page signature in this embodiment is a 20-byte signature but is not based on the content of the metadata page. Instead, the metadata page signature is generated based on an 8-byte metadata page identifier that is a function of the LUN identifier and offset information of that metadata page.

If a user wants to read a user data page having a particular LUN identifier and offset, the corresponding metadata page identifier is first determined, then the metadata page signature is computed for the identified metadata page, and then the metadata page is read using the computed signature. In this embodiment, the metadata page signature is more particularly computed using a signature generation algorithm that generates the signature to include a hash of the 8-byte metadata page identifier, one or more ASCII codes for particular predetermined characters, as well as possible additional fields. The last bit of the metadata page signature may always be set to a particular logic value so as to distinguish it from the user data page signature in which the last bit may always be set to the opposite logic value.

The metadata page signature is used to retrieve the metadata page via the D-module. This metadata page will include the <lun_id, offset, signature> for the user data page if the user page exists. The signature of the user data page is then used to retrieve that user data page, also via the D-module.

Write requests processed in the content addressable storage system 505 each illustratively comprise one or more IO operations directing that at least one data item of the storage system 505 be written to in a particular manner. A given write request is illustratively received in the storage system 505 from a host device, illustratively one of the host devices 202. In some embodiments, a write request is received in the distributed storage controller 508 of the storage system 505, and directed from one processing module to another processing module of the distributed storage controller 508. For example, a received write request may be directed from a routing module 508R of the distributed storage controller 508 to a particular control module 508C of the distributed storage controller 508. Other arrangements for receiving and processing write requests from one or more host devices can be used.

The term "write request" as used herein is intended to be broadly construed, so as to encompass one or more IO operations directing that at least one data item of a storage system be written to in a particular manner. A given write request is illustratively received in a storage system from a host device.

In the XtremIO™ context, the C-modules, D-modules and R-modules of the storage nodes 515 communicate with one another over a high-speed internal network such as an InfiniBand network. The C-modules, D-modules and R-modules coordinate with one another to accomplish various IO processing tasks.

The write requests from the host devices identify particular data pages to be written in the storage system 505 by their corresponding logical addresses each comprising a LUN ID and an offset.

As noted above, a given one of the content-based signatures illustratively comprises a hash digest of the corresponding data page, with the hash digest being generated by applying a hash function to the content of that data page. The hash digest may be uniquely represented within a given storage resource boundary by a corresponding hash handle.

The storage system 505 utilizes a two-level mapping process to map logical block addresses to physical block addresses. The first level of mapping uses an address-to-hash ("A2H") table and the second level of mapping uses a hash metadata ("HMD") table, with the A2H and HMD tables corresponding to respective logical and physical layers of the content-based signature mapping within the storage system 505.

The first level of mapping using the A2H table associates logical addresses of respective data pages with respective content-based signatures of those data pages. This is also referred to logical layer mapping.

The second level of mapping using the HMD table associates respective ones of the content-based signatures with respective physical storage locations in one or more of the storage devices 506. This is also referred to as physical layer mapping.

For a given write request, both of the corresponding HMD and A2H tables are updated in conjunction with the processing of that write request.

The A2H and HMD tables described above are examples of what are more generally referred to herein as "mapping tables" of respective first and second distinct types. Other types and arrangements of mapping tables or other content-based signature mapping information may be used in other embodiments.

The logical block addresses or LBAs of a logical layer of the storage system 505 correspond to respective physical blocks of a physical layer of the storage system 505. The user data pages of the logical layer are organized by LBA and have reference via respective content-based signatures to particular physical blocks of the physical layer.

Each of the physical blocks has an associated reference count that is maintained within the storage system 505. The reference count for a given physical block indicates the number of logical blocks that point to that same physical block.

In releasing logical address space in the storage system, a dereferencing operation is generally executed for each of the LBAs being released. More particularly, the reference count of the corresponding physical block is decremented. A reference count of zero indicates that there are no longer any logical blocks that reference the corresponding physical block, and so that physical block can be released.

It should also be understood that the particular arrangement of storage controller processing modules 508C, 508D, 508R and 508M as shown in the FIG. 5 embodiment is presented by way of example only. Numerous alternative arrangements of processing modules of a distributed storage controller may be used to implement data integrity test functionality in a clustered storage system in other embodiments.

Additional examples of content addressable storage functionality implemented in some embodiments by control modules 508C, data modules 508D, routing modules 508R and management module(s) 508M of distributed storage controller 508 can be found in U.S. Pat. No. 9,104,326, entitled "Scalable Block Data Storage Using Content Addressing," which is incorporated by reference herein. Alternative arrangements of these and other storage node processing modules of a distributed storage controller in a content addressable storage system can be used in other embodiments.

Illustrative embodiments of host devices or storage systems with data integrity test functionality as disclosed herein can provide a number of significant advantages relative to conventional arrangements.

Some embodiments provide enhanced techniques for data integrity testing that advantageously avoid the problems that can arise in conjunction with generation of a test metadata file. For example, one or more such embodiments are configured to incorporate the test metadata file into a replication consistency group that is defined as part of a replication process. Such an arrangement can ensure consistency between the test metadata file and a corresponding PIT replica, thereby providing more accurate data integrity test results when utilizing the test metadata file to perform a data integrity test.

Illustrative embodiments can be configured to perform data integrity testing in a wide variety of different contexts involving PIT replicas such as snapshots of one or more logical storage volumes of a storage system. For example, one such context involves asynchronous replication of data from a first storage system to a second storage system. Other contexts include local replication within a given storage system, or other types of processing involving the generation of clones, copies or other types of replicas.

Illustrative embodiments can provide significant data integrity test performance improvements in these and any other processing contexts in which consistent replicas are needed and in which data integrity tests are performed using a test metadata file.

These and other embodiments can advantageously avoid the need for any significant modification to existing source code utilized for data integrity testing.

Also, the disclosed techniques in illustrative embodiments avoid the need for any substantial interruption in the flow of 10 operations during asynchronous replication in order to maintain consistency between a test metadata file and a PIT replica to be subject to data integrity testing.

Moreover, illustrative embodiments may include any type of host device or associated storage system comprising at least one block storage device and suitably configured in accordance with the techniques disclosed herein.

Functionality for data integrity testing utilizing a replicated test metadata file can be implemented in a host device, in a storage system, or partially in a host device and partially in a storage system.

It is to be appreciated that the particular advantages described above and elsewhere herein are associated with particular illustrative embodiments and need not be present in other embodiments. Also, the particular types of information processing system features and functionality as illustrated in the drawings and described above are exemplary only, and numerous other arrangements may be used in other embodiments.

Illustrative embodiments of processing platforms utilized to implement host devices and storage systems with data integrity test functionality will now be described in greater detail with reference to FIGS. 6 and 7. Although described in the context of system 100, these platforms may also be used to implement at least portions of other information processing systems in other embodiments.

Figure 6:
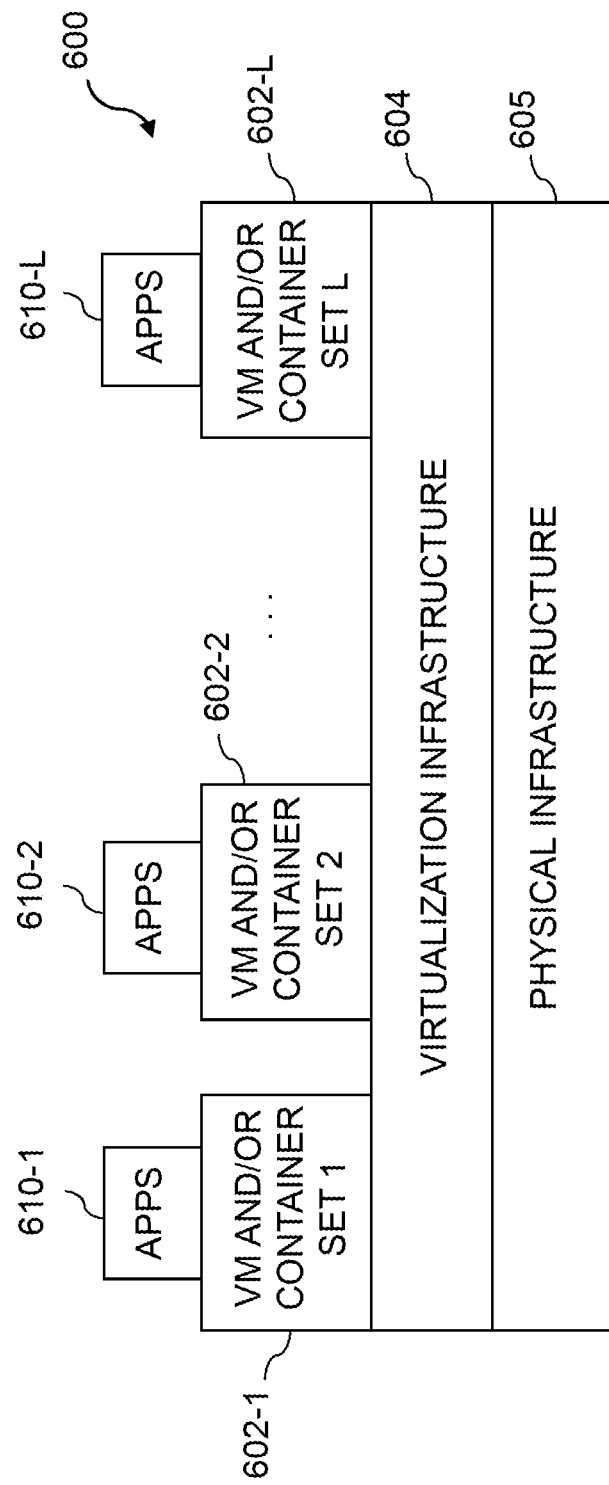
FIGS. 6 and 7 show examples of processing platforms that may be utilized to implement at least a portion of an information processing system in illustrative embodiments.
Figure 7:
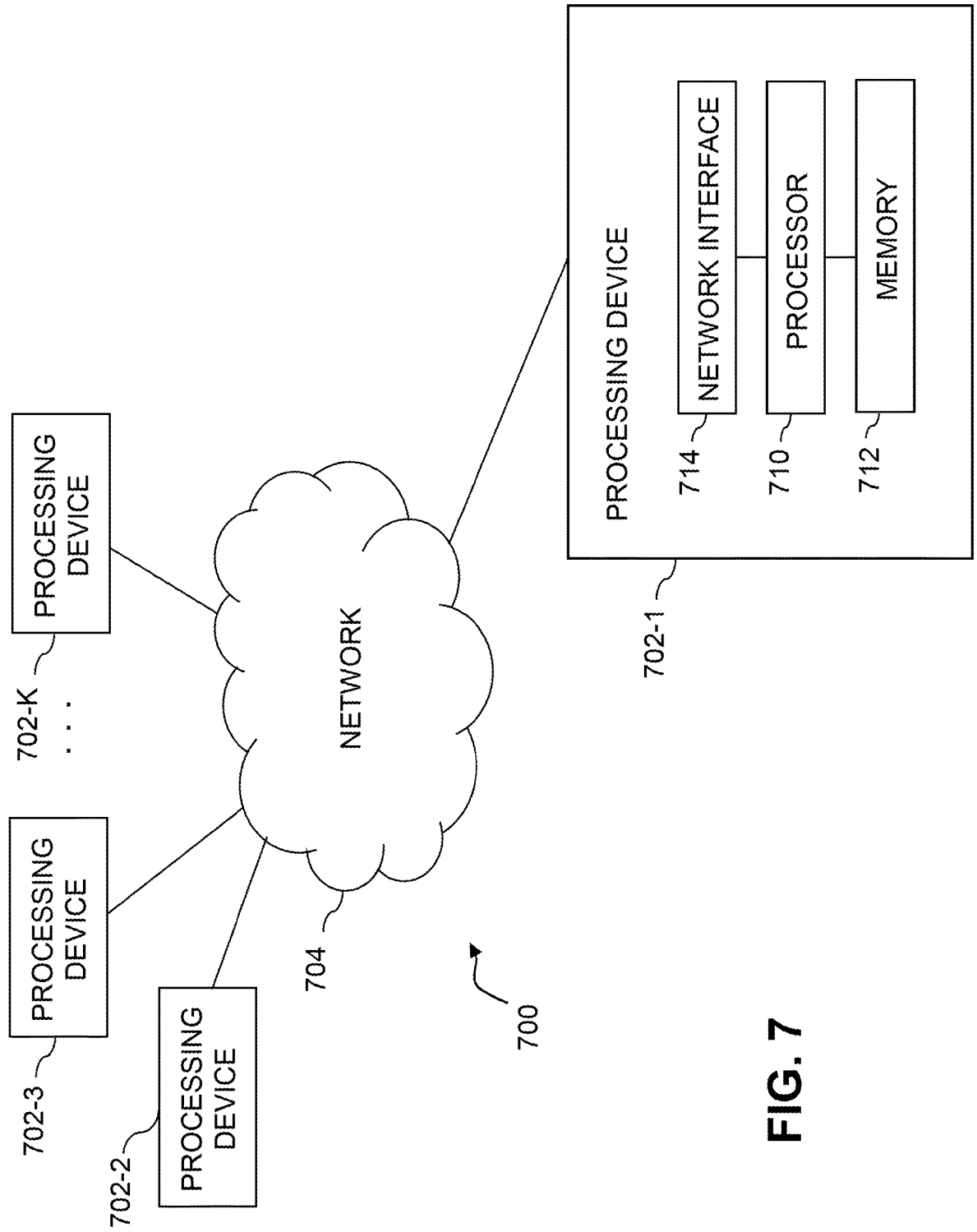

FIG. 6 shows an example processing platform comprising cloud infrastructure 600. The cloud infrastructure 600 comprises a combination of physical and virtual processing resources that may be utilized to implement at least a portion of the information processing system 100. The cloud infrastructure 600 comprises multiple virtual machines (VMs) and/or container sets 602-1, 602-2, . . . 602-L implemented using virtualization infrastructure 604. The virtualization infrastructure 604 runs on physical infrastructure 605, and illustratively comprises one or more hypervisors and/or operating system level virtualization infrastructure. The operating system level virtualization infrastructure illustratively comprises kernel control groups of a Linux operating system or other type of operating system.

The cloud infrastructure 600 further comprises sets of applications 610-1, 610-2, . . . 610-L running on respective ones of the VMs/container sets 602-1, 602-2, . . . 602-L under the control of the virtualization infrastructure 604. The VMs/container sets 602 may comprise respective VMs, respective sets of one or more containers, or respective sets of one or more containers running in VMs.

In some implementations of the FIG. 6 embodiment, the VMs/container sets 602 comprise respective VMs implemented using virtualization infrastructure 604 that comprises at least one hypervisor. Such implementations can provide data integrity test functionality of the type described above for one or more processes running on a given one of the VMs. For example, each of the VMs can implement data integrity test control logic for providing data integrity test functionality for one or more processes running on that particular VM.

An example of a hypervisor platform that may be used to implement a hypervisor within the virtualization infrastructure 604 is the VMware® vSphere® which may have an associated virtual infrastructure management system such as the VMware® vCenter™. The underlying physical machines may comprise one or more distributed processing platforms that include one or more storage systems.

In other implementations of the FIG. 6 embodiment, the VMs/container sets 602 comprise respective containers implemented using virtualization infrastructure 604 that provides operating system level virtualization functionality, such as support for Docker containers running on bare metal hosts, or Docker containers running on VMs. The containers are illustratively implemented using respective kernel control groups of the operating system. Such implementations can provide data integrity test functionality of the type described above for one or more processes running on different ones of the containers. For example, a container host device supporting multiple containers of one or more container sets can implement one or more instances of data integrity test control logic for use in performing data integrity tests.

As is apparent from the above, one or more of the processing modules or other components of system 100 may each run on a computer, server, storage device or other processing platform element. A given such element may be viewed as an example of what is more generally referred to herein as a "processing device." The cloud infrastructure 600 shown in FIG. 6 may represent at least a portion of one processing platform. Another example of such a processing platform is processing platform 700 shown in FIG. 7.

The processing platform 700 in this embodiment comprises a portion of system 100 and includes a plurality of processing devices, denoted 702-1, 702-2, 702-3, . . . 702-K, which communicate with one another over a network 704.

The network 704 may comprise any type of network, including by way of example a global computer network such as the Internet, a WAN, a LAN, a satellite network, a telephone or cable network, a cellular network, a wireless network such as a WiFi or WiMAX network, or various portions or combinations of these and other types of networks.

The processing device 702-1 in the processing platform 700 comprises a processor 710 coupled to a memory 712.

The processor 710 may comprise a microprocessor, a microcontroller, an application-specific integrated circuit (ASIC), a field-programmable gate array (FPGA) or other type of processing circuitry, as well as portions or combinations of such circuitry elements.

The memory 712 may comprise random access memory (RAM), read-only memory (ROM), flash memory or other types of memory, in any combination. The memory 712 and other memories disclosed herein should be viewed as illustrative examples of what are more generally referred to as "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM, flash memory or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 702-1 is network interface circuitry 714, which is used to interface the processing device with the network 704 and other system components, and may comprise conventional transceivers.

The other processing devices 702 of the processing platform 700 are assumed to be configured in a manner similar to that shown for processing device 702-1 in the figure.

Again, the particular processing platform 700 shown in the figure is presented by way of example only, and system 100 may include additional or alternative processing platforms, as well as numerous distinct processing platforms in any combination, with each such platform comprising one or more computers, servers, storage devices or other processing devices.

For example, other processing platforms used to implement illustrative embodiments can comprise converged infrastructure such as VxRail™, VxRack™, VxRack™ FLEX, VxBlock™ or Vblock® converged infrastructure from VCE, the Virtual Computing Environment Company, now the Converged Platform and Solutions Division of Dell EMC.

It should therefore be understood that in other embodiments different arrangements of additional or alternative elements may be used. At least a subset of these elements may be collectively implemented on a common processing platform, or each such element may be implemented on a separate processing platform.

As indicated previously, components of an information processing system as disclosed herein can be implemented at least in part in the form of one or more software programs stored in memory and executed by a processor of a processing device. For example, at least portions of the data integrity test functionality of one or more components of a host device or storage system as disclosed herein are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems, host devices, storage systems, storage nodes, storage devices, storage controllers, data integrity test processes, replication processes, and associated control logic and PIT replica generators. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. An apparatus comprising:
at least one processing device comprising a processor coupled to a memory;
the processing device being configured:
to schedule generation of a point-in-time replica of one or more logical storage volumes of a storage system;
to generate a test metadata file for a data integrity test to be performed utilizing the point-in-time replica; and
to store the test metadata file in at least one of the one or more logical storage volumes for which the point-in-time replica is to be generated;
wherein the one or more logical storage volumes form at least a portion of a replication consistency group with the replication consistency group being defined to include the test metadata file as at least a portion of a particular one of the one or more logical storage volumes.

2. The apparatus of claim 1 wherein the processing device is implemented in a host device configured to communicate over a network with the storage system.

3. The apparatus of claim 1 wherein the processing device is implemented in the storage system.

4. The apparatus of claim 1 wherein the point-in-time replica comprises a snapshot of the replication consistency group comprising the one or more logical storage volumes of the storage system.

5. The apparatus of claim 1 wherein scheduling the generation of the point-in-time replica of the one or more logical storage volumes of the storage system comprises initiating an asynchronous replication process for the replication consistency group comprising the one or more logical storage volumes of the storage system.

6. The apparatus of claim 1 wherein generating the test metadata file comprises:
creating the test metadata file; and
writing information characterizing a plurality of operations of the data integrity test into the test metadata file.

7. The apparatus of claim 1 wherein storing the test metadata file in at least one of the one or more logical storage volumes for which the point-in-time replica is to be generated ensures that content of the test metadata file is captured in a manner consistent with generation of the point-in-time replica for other portions of the one or more logical storage volumes.

8. The apparatus of claim 1 wherein the test metadata file comprises at least one test log of the data integrity test.

9. The apparatus of claim 1 wherein the test metadata file comprises at least one designated test log volume of the storage system.

10. The apparatus of claim 1 wherein the test metadata file is stored as at least a portion of a particular one of the one or more logical storage volumes of the storage system.

11. The apparatus of claim 1 wherein the data integrity test is configured to confirm consistency of a plurality of data pages written by one or more write operations relative to the point-in-time replica.

12. A method comprising:
scheduling generation of a point-in-time replica of one or more logical storage volumes of a storage system;
generating a test metadata file for a data integrity test to be performed utilizing the point-in-time replica; and
storing the test metadata file in at least one of the one or more logical storage volumes for which the point-in-time replica is to be generated;
wherein the one or more logical storage volumes form at least a portion of a replication consistency group with the replication consistency group being defined to include the test metadata file as at least a portion of a particular one of the one or more logical storage volumes; and
wherein the method is implemented by at least one processing device comprising a processor coupled to a memory.

13. The method of claim 12 wherein the point-in-time replica comprises a snapshot of the replication consistency group comprising the one or more logical storage volumes of the storage system.

14. The method of claim 12 wherein scheduling generation of the point-in-time replica of the one or more logical storage volumes of the storage system comprises initiating an asynchronous replication process for the replication consistency group comprising the one or more logical storage volumes of the storage system.

15. The method of claim 12 wherein generating the test metadata file comprises:
   creating the test metadata file; and
   writing information characterizing a plurality of operations of the data integrity test into the test metadata file.

16. A computer program product comprising a non-transitory processor-readable storage medium having stored therein program code of one or more software programs, wherein the program code when executed by at least one processing device causes said at least one processing device:
   to schedule generation of a point-in-time replica of one or more logical storage volumes of a storage system;
   to generate a test metadata file for a data integrity test to be performed utilizing the point-in-time replica; and
   to store the test metadata file in at least one of the one or more logical storage volumes for which the point-in-time replica is to be generated;
   wherein the one or more logical storage volumes form at least a portion of a replication consistency group with the replication consistency group being defined to include the test metadata file as at least a portion of a particular one of the one or more logical storage volumes.

17. The computer program product of claim 16 wherein the point-in-time replica comprises a snapshot of the replication consistency group comprising the one or more logical storage volumes of the storage system.

18. The computer program product of claim 16 wherein scheduling the generation of the point-in-time replica of the one or more logical storage volumes of the storage system comprises initiating an asynchronous replication process for the replication consistency group comprising the one or more logical storage volumes of the storage system.

19. The computer program product of claim 16 wherein generating the test metadata file comprises:
   creating the test metadata file; and
   writing information characterizing a plurality of operations of the data integrity test into the test metadata file.

20. The computer program product of claim 16 wherein storing the test metadata file in at least one of the one or more logical storage volumes for which the point-in-time replica is to be generated ensures that content of the test metadata file is captured in a manner consistent with generation of the point-in-time replica for other portions of the one or more logical storage volumes.

* * * * *